(12) United States Patent
Tanaka

(10) Patent No.: US 7,474,581 B2
(45) Date of Patent: Jan. 6, 2009

(54) MEMORY SYNCHRONIZATION METHOD AND REFRESH CONTROL CIRCUIT

(75) Inventor: Yukihiro Tanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 75 days.

(21) Appl. No.: 11/698,165

(22) Filed: Jan. 26, 2007

(65) Prior Publication Data

US 2007/0183243 A1   Aug. 9, 2007

(30) Foreign Application Priority Data

Feb. 7, 2006   (JP)   ............................. 2006-029602

(51) Int. Cl.
*G11C 7/00*   (2006.01)

(52) U.S. Cl. ............... 365/222; 365/233.1; 365/233.11; 365/228; 365/185.11; 365/185.09; 714/12; 713/375; 713/400

(58) Field of Classification Search ................. 365/222, 365/233.1, 233.11, 228, 185.11, 185.09; 714/12; 713/375, 400
See application file for complete search history.

(56) References Cited

U.S. PATENT DOCUMENTS

| | | | | |
|---|---|---|---|---|
| 4,106,108 A | * | 8/1978 | Cislaghi et al. .............. 365/222 |
| 5,146,589 A | * | 9/1992 | Peet et al. ...................... 714/3 |
| 5,226,152 A | * | 7/1993 | Klug et al. ..................... 714/12 |
| 5,600,784 A | * | 2/1997 | Bissett et al. .................. 714/12 |
| 5,959,923 A | * | 9/1999 | Matteson et al. ............. 365/222 |
| 7,345,941 B2 | * | 3/2008 | Matsui ........................ 365/222 |
| 2007/0121410 A1 | * | 5/2007 | Mori ........................... 365/222 |

FOREIGN PATENT DOCUMENTS

| | | |
|---|---|---|
| JP | 62-60195 | 3/1987 |
| JP | 4-281288 | 10/1992 |
| JP | 7-9625 | 2/1995 |
| JP | 07-73059 | 3/1995 |
| JP | 11-195293 | 7/1999 |
| JP | 11-338832 | 12/1999 |
| JP | 2000-330812 | 11/2000 |
| JP | 2004-110803 | 4/2004 |
| WO | WO 99/26133 | 5/1999 |

* cited by examiner

*Primary Examiner*—J. H. Hur
*Assistant Examiner*—Eric Wendler
(74) *Attorney, Agent, or Firm*—McGinn IP Law Group, PLLC

(57) ABSTRACT

Rank numbers specified by a second counter are refreshed in sequence by using a count value of a first counter which is initialized by a synchronous reset signal and counts timing for performing refresh, and the rank numbers specified by a refresh rank control unit are continuously refreshed in sequence in the case where the synchronous reset signal is active.

5 Claims, 11 Drawing Sheets

MEMORY SYNCHRONIZATION METHOD AND REFRESH CONTROL CIRCUIT

BACKGROUND OF THE INVENTION

1. Field of the Invention

The present invention relates to a memory synchronization method and a refresh control circuit for synchronizing timing for refresh of multiple ranks of mounted memory.

2. Description of the Related Art

There is a conventionally known fault-tolerant computer which multiplexes (double or triple for instance) components constituting hardware of the computer such as a CPU (Central Processing Unit), a memory, a disk, a network, a power supply and the like in a computer system to allow uninterrupted operation without stopping the computer system even if one of the components is at fault.

In the case of the fault-tolerant computer, there are a lock-step method wherein multiplexed mutual components constantly executes the same operation in the same timing and in synchronization and a method of allowing certain components to go out of synchronization by getting processing results together and making a comparison. These are described in Japanese Patent Laid-Open No. 1999-338832 and Japanese Patent Laid-Open No. 2004-110803 for instance.

To implement a complete lockstep of a CPU bus in this connection, processing for the components thereunder needs to be synchronized. In particular, access to the memory requires high-speed processing, and so it is desirable that complete lockstep operation be also performed between the CPU and the memory.

The memory used for a general computer system is a type called DRAM (Dynamic Random Access Memory), which requires electric charge to be periodically replenished by a refresh operation in order to hold memory contents. Even when the access from the CPU to the memory is in synchronization, the timing of data returned from the memory to the CPU may be off if the timing of refresh is off.

Factors behind the off-timing refresh will be described.

FIG. 1 is a block diagram of a circuit for periodically generating the refresh.

As for the circuit shown in FIG. 1, a refresh counter 1 counts the timing for performing the refresh. It becomes an initial value 0 under an asynchronous reset signal RST which is asynchronous, and operates in synchronization with a clock signal CLK. It can also be the initial value 0 under a synchronous reset signal. In FIG. 1, a refresh counter asynchronous reset signal 112 is inputted. A refresh interval register 2 is a register for setting an interval of the refresh. As for the interval of the refresh, a maximum period (tREF I) is decided according to the kind of memory to be used. For instance, it is 7.8 μs or 3.9 μs in the case of DDR SDRAM and DDR2 SDRAM prescribed by JEDEC. In the case of performing the refresh with a period of 7.8 μs when a frequency of the clock signal CLK is 200 MHz for instance, the value of the refresh interval register 2 is set at 1560 (7.8 μs/5 ns). A refresh interval comparison portion 4 compares the value of the refresh counter 1 to the value of the refresh interval register 2 and outputs "1" if they match. A memory command generating portion 7 adjusts the refresh and other requests (omitted in FIG. 1) and issues an optimal command to a memory bus.

FIG. 2 is a timing chart showing operation of the circuit shown in FIG. 1.

The refresh counter 1 is initialized to 0 under the asynchronous reset signal RST, and the refresh counter 1 counts it up in synchronization with the clock signal CLK.

If the value of the refresh counter 1 matches with the value of the refresh interval register 2, the refresh counter asynchronous reset signal 112 becomes active and announces a start of the refresh. The refresh counter 1 is initialized to 0 by the refresh counter asynchronous reset signal 112 so as to continue the count.

Wait REF to Req Busy shown in FIG. 2 are internal signals of the memory command generating portion 7. When the refresh counter asynchronous reset signal 112 is asserted, Req Busy is active so that the refresh cannot be started at once and the Wait REF signal becomes active. If Req Busy is released, OK REF is asserted and a refresh command is issued to the memory.

Therefore, the timing for issuing the refresh command to the memory is based on the timing of the refresh counter 1. To synchronize refresh timing of multiplexed memory, it is necessary to synchronize the counter for deciding a refresh period.

FIG. 3 is a diagram showing the fault-tolerant computer doubled by a board A and a board B. Hereunder, a description will be given as to a problem in the case of synchronizing the timing of memory refresh of the fault-tolerant computer shown in FIG. 3.

FIG. 4 is a diagram showing the problem due to the timing of an asynchronous reset of the fault-tolerant computer shown in FIG. 3.

In the case where the asynchronous reset is simultaneously performed to each of the board A and the board B shown in FIG. 3, a characteristic of a reset route of each board may be a little different or a setup or a hold may not be satisfied even when it is completely simultaneous. Therefore, the counter values may be different depending on the timing of the asynchronous reset as shown in FIG. 4.

FIG. 5 is a diagram showing the operation when restarting the board A on the fault-tolerant computer shown in FIG. 3.

In the case of the fault-tolerant computer, a module at fault is separated and remounted. In this case, however, the module in operation is not initialized by asynchronous reset so that the counter values do not match as shown in FIG. 5.

FIG. 6 is a diagram showing order of commands issued to the memory bus in the case where the timing of a refresh request is off and synchronized memory reads compete in the memory command generating portion 7 in the fault-tolerant computer shown in FIG. 3.

As shown in FIG. 6, Read is asserted in the same timing on the board A and the board B. In this case, Start REF timing of the board A is 1 clock behind Start REF of the board B. In the case of the board A, Read and Start REF are simultaneous. If priority of Read is high, a read command is issued to the memory, and precharge (in the case where a refresh subject rank is open) and refresh are subsequently issued respectively.

On the board B, Start REF was asserted before Read so that a refresh process is performed first and the read is subsequently issued. If it is the read to the same rank as the refresh, the read command can be issued by performing activation after a sufficient time (t RFC) following the refresh command as shown in FIG. 6.

Therefore, there are the cases where, if the refresh request is different just by 1 clock, the response of the data which is read from the memory is different by dozens of clocks or over.

Various techniques are conceived as to the above-mentioned memory refresh operation. These are described in Japanese Patent Laid-Open No. 1995-73059, Japanese Patent Publication No. 1995-9625 and Japanese Patent Laid-Open No. 2000-330812 for instance.

Although Japanese Patent Laid-Open No. 1995-73059 and Japanese Patent Publication No. 1995-9625 describe a method of hiding the refresh operation from other memory access by delaying the refresh operation, there is a problem that the lockstep operation cannot be assured in the case where the counter value for deciding the refresh timing is different by the board.

There is also a problem that performance degradation of the memory access occurs in the system which assures the lockstep by waiting for the timing for returning read data to the module having made a request to the memory.

What is described in Japanese Patent Laid-Open No. 2000-330812 merely times a refresh circuit when initializing the memory, and no consideration is given to the access from a high order module for exerting refresh control over multiple memory modules.

SUMMARY OF THE INVENTION

An object of the present invention is to provide a memory synchronization method and a refresh control circuit which can synchronize timing of refresh of multiple ranks of mounted memory and minimize performance degradation of normal memory access.

According to the present invention, normal refresh is performed to the multiple ranks of mounted memory in a normal state, where the refresh is sequentially performed by using a count value of a counter initialized by a synchronous reset signal at predetermined first intervals. In the case where the synchronous reset signal becomes active, high-speed refresh is performed by sequentially performing the refresh at second intervals which are shorter than the first intervals. Thus, the synchronous reset signal is given in the same timing to a board to be synchronized. And the counter as the timing for the refresh is initialized so that the timing for the refresh thereafter synchronizes. Moreover, the refresh is intensively performed only when the synchronous reset signal is given so that the performance degradation of normal memory access is minimized.

The above and other objects, features, and advantages of the present invention will become apparent from the following description with reference to the accompanying drawings, which illustrate examples of the present invention.

DETAILED DESCRIPTION OF THE PREFERRED EMBODIMENTS

Figure 7:
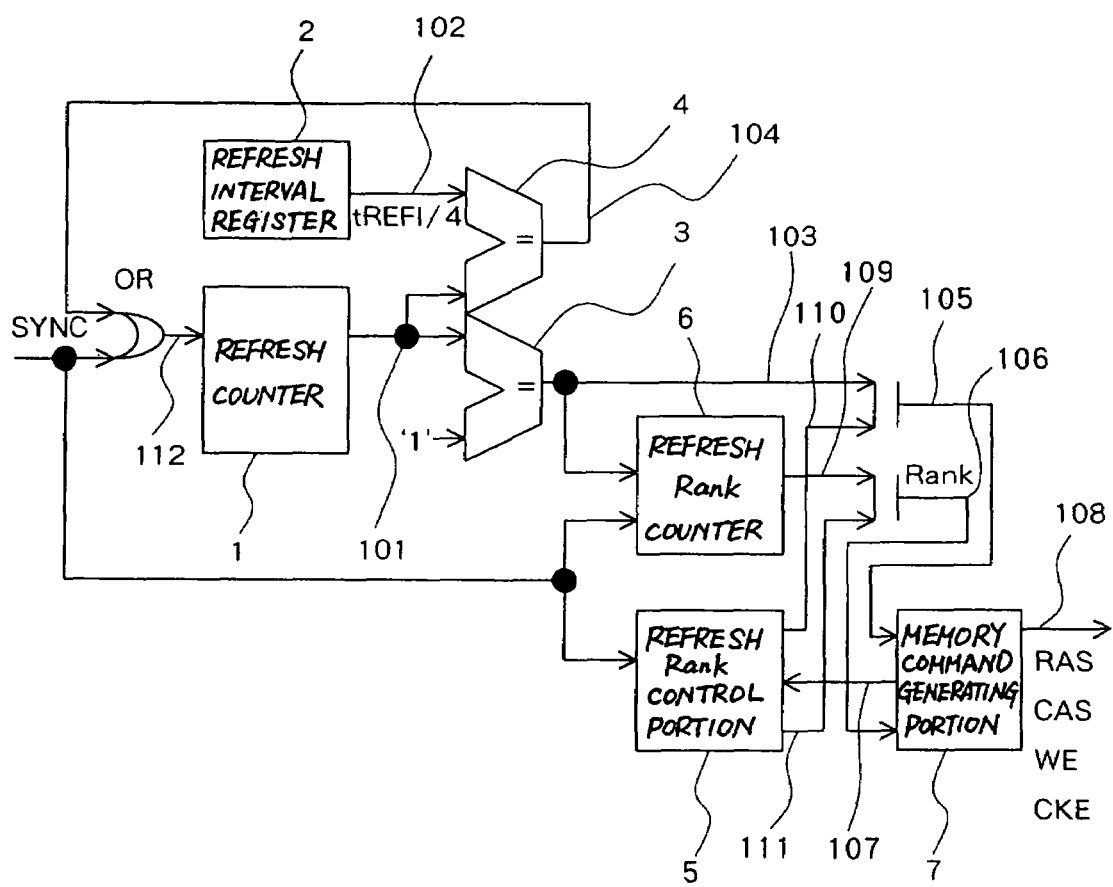
FIG. 7 is a diagram showing an embodiment of a refresh control circuit according to the present invention.

FIG. 7 is a diagram showing an embodiment of a refresh control circuit according to the present invention.

As shown in FIG. 7, this embodiment is composed of a refresh counter 1 as a first counter, a refresh interval register 2 as refresh interval setting means, a refresh interval comparison portion 4 as first comparison means, a refresh timing comparison portion 3 as second comparison means, a refresh rank counter 6 as a second counter, a refresh rank control portion 5 and a memory command generating portion 7. This embodiment synchronizes timing of refresh of multiple ranks of mounted memory.

The refresh counter 1 counts the timing for performing the refresh. The refresh counter 1 operates in synchronization with a clock signal and increases by +1 each time a clock rises so as to output a refresh count value 101. And the count value is initialized by a synchronous reset signal SYNC or a refresh initialization signal 104.

The refresh interval register 2 is a register for arbitrarily setting intervals of the refresh, and outputs a refresh interval value 102 which indicates the intervals.

The refresh interval comparison portion 4 compares the refresh count value 101 outputted from the refresh counter 1 with the refresh interval value 102 outputted from the refresh interval register 2. In the case where they match, it outputs the refresh initialization signal 104 for initializing the refresh counter 1 as "1".

In the case where the refresh count value 101 outputted from the refresh counter 1 becomes a predetermined value ("1" for instance), the refresh timing comparison portion 3 outputs a refresh start signal (Start REF) 103 as "1".

The refresh rank counter 6 is a counter which counts up when the refresh start signal (Start REF) 103 outputted from the refresh timing comparison portion 3 is "1", and outputs the count value as a normal refresh rank number 109. The normal refresh rank number 109 indicates a rank number of a refresh subject memory (DIMM). To be more specific, it increments the rank number each time the refresh start signal (Start REF) 103 outputted from the refresh timing comparison portion 3 becomes "1". And the count value is initialized by the synchronous reset signal SYNC.

If the synchronous reset signal SYNC becomes active, the refresh rank control portion 5 activates and outputs a high-speed refresh request signal 110 in refresh timing for synchronizing the refresh. And in the case of being notified of a refresh issue notification signal 107 from the memory command generating portion 7, it increments the rank number included in the refresh issue notification signal 107 and outputs it as a high-speed request rank number 111.

The memory command generating portion 7 adjusts the refresh and other requests, and issues a command to a memory bus in optimal timing. The memory command generating portion 7 generates a command for performing the refresh to the rank of the rank number of the normal refresh rank number 109 outputted from the refresh rank counter 6 according to the refresh start signal (Start REF) 103 outputted from the refresh timing comparison portion 3, and outputs the refresh issue notification signal 107 in the case where the refresh is issued to the rank. In the case where the high-speed refresh request signal 110 is outputted from the refresh rank control portion 5, the memory command generating portion 7 generates a command for performing the refresh to the rank of the rank number of the high-speed request rank number 111 outputted from the refresh rank control portion 5.

Hereunder, a description will be given as to a memory synchronization method using a refresh control circuit constituted as above.

Figure 8:
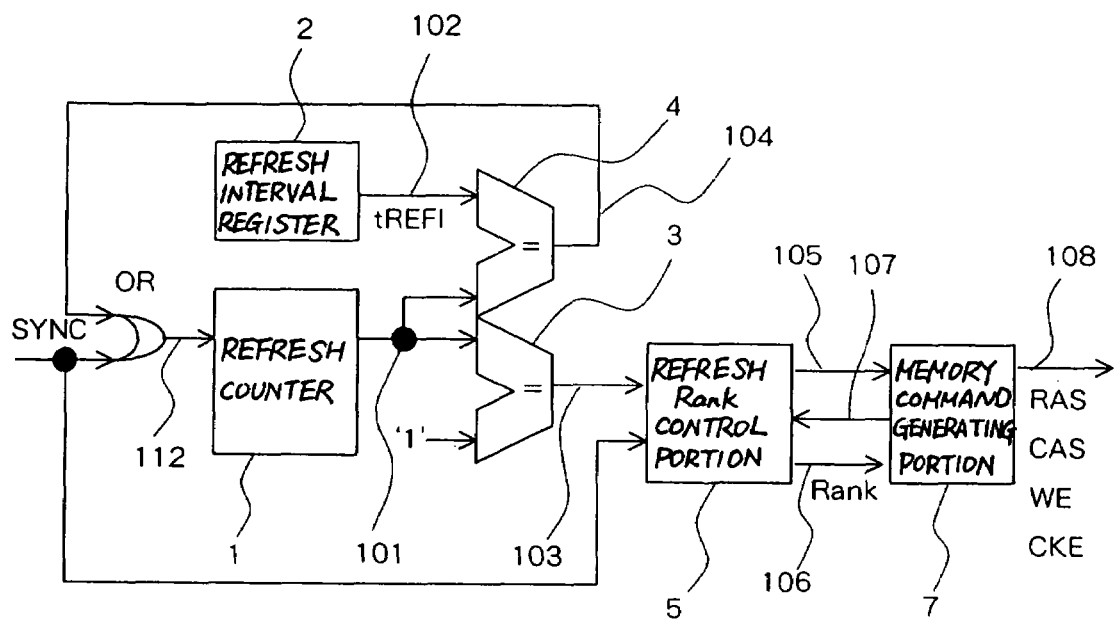
FIG. 8 is a diagram showing a circuit configuration for describing a basic operation of the refresh control circuit shown in FIG. 7.

FIG. 8 is a diagram showing a circuit configuration for describing a basic operation of the refresh control circuit shown in FIG. 7.

Figure 1:
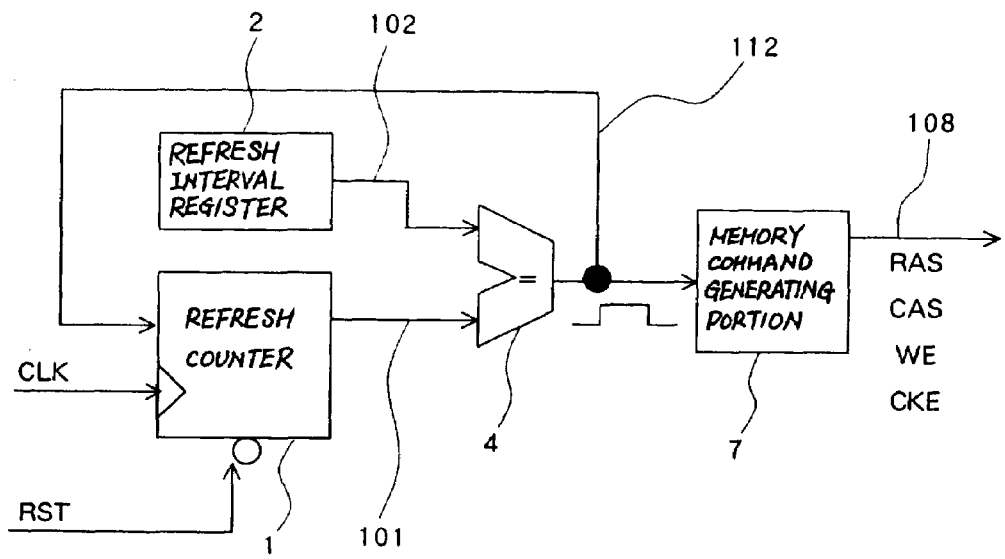
FIG. 1 is a block diagram of a circuit for periodically generating refresh.
Figure 2:
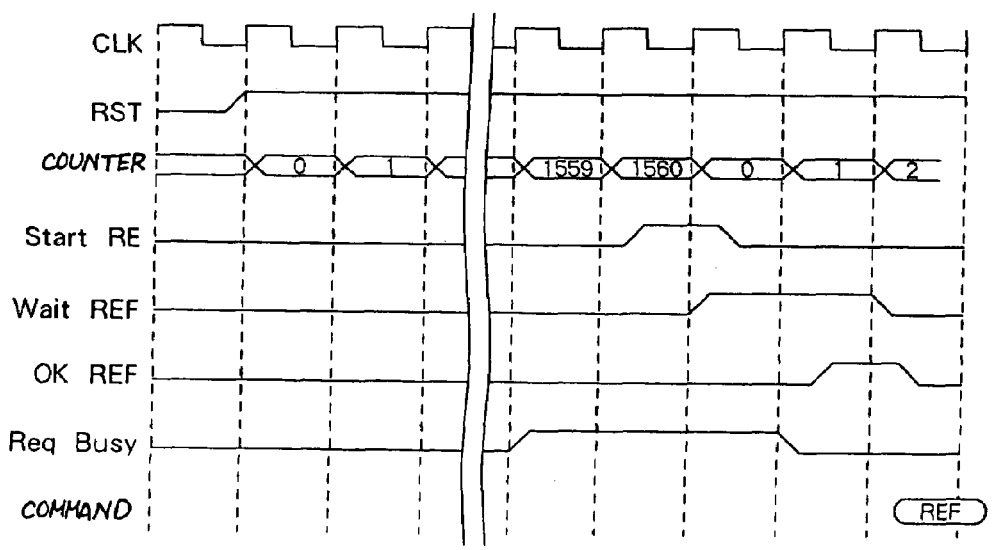
FIG. 2 is a timing chart showing an operation of the circuit shown in FIG. 1.
Figure 3:
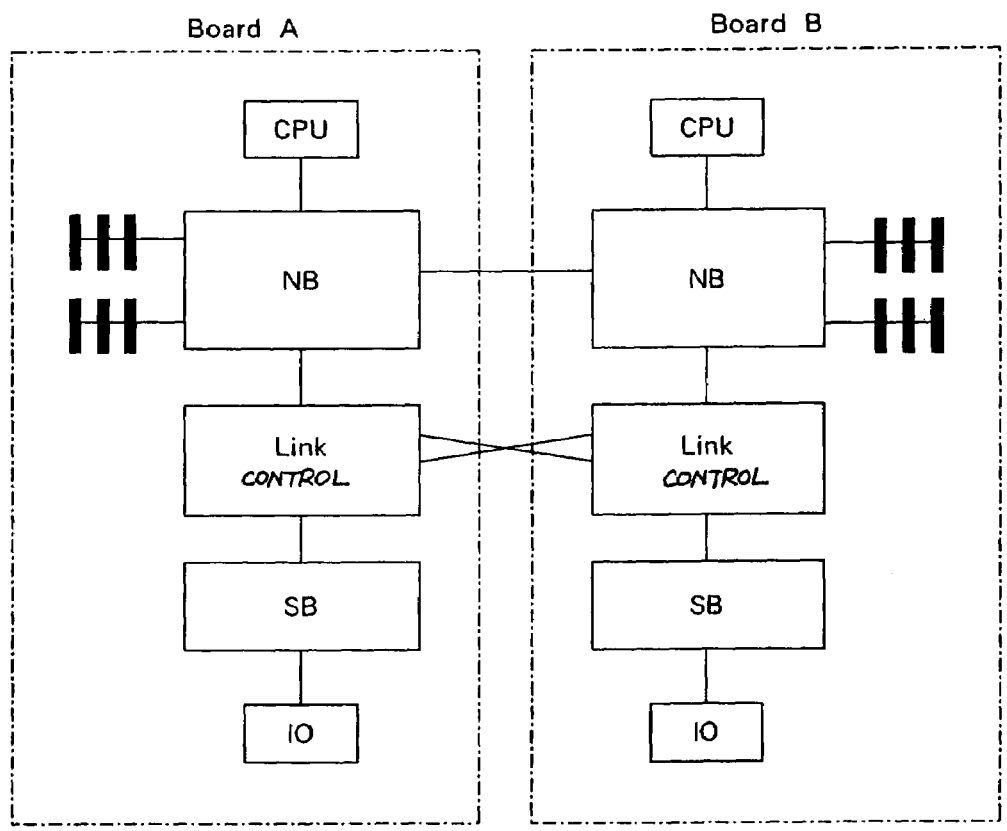
FIG. 3 is a diagram showing the fault-tolerant computer doubled by a board A and a board B.
Figure 4:
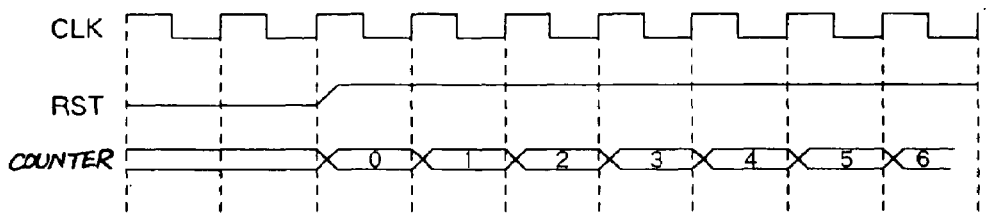
FIG. 4 is a diagram showing a problem due to timing of an asynchronous reset of the fault-tolerant computer shown in FIG. 3.
Figure 4:
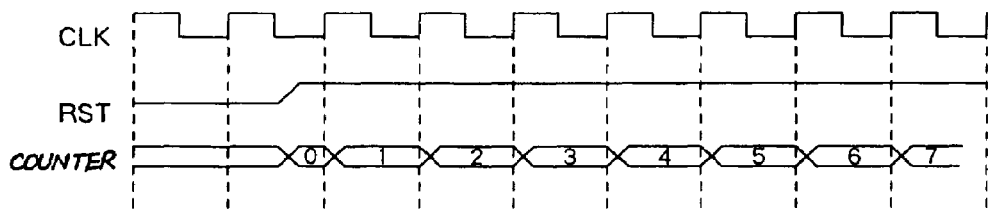
Figure 5:
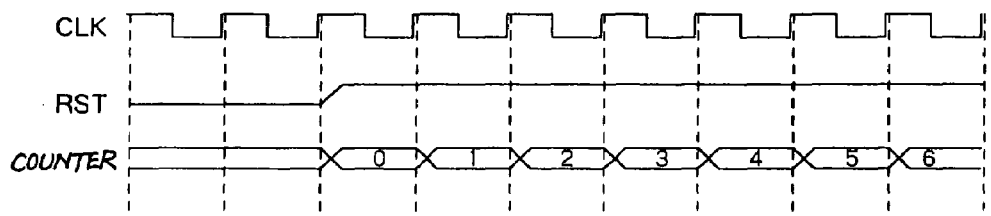
FIG. 5 is a diagram showing the operation when restarting the board A on the fault-tolerant computer shown in FIG. 3.
Figure 5:
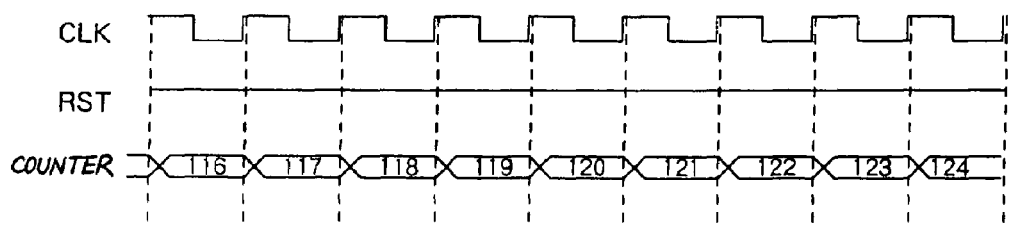
Figure 6:
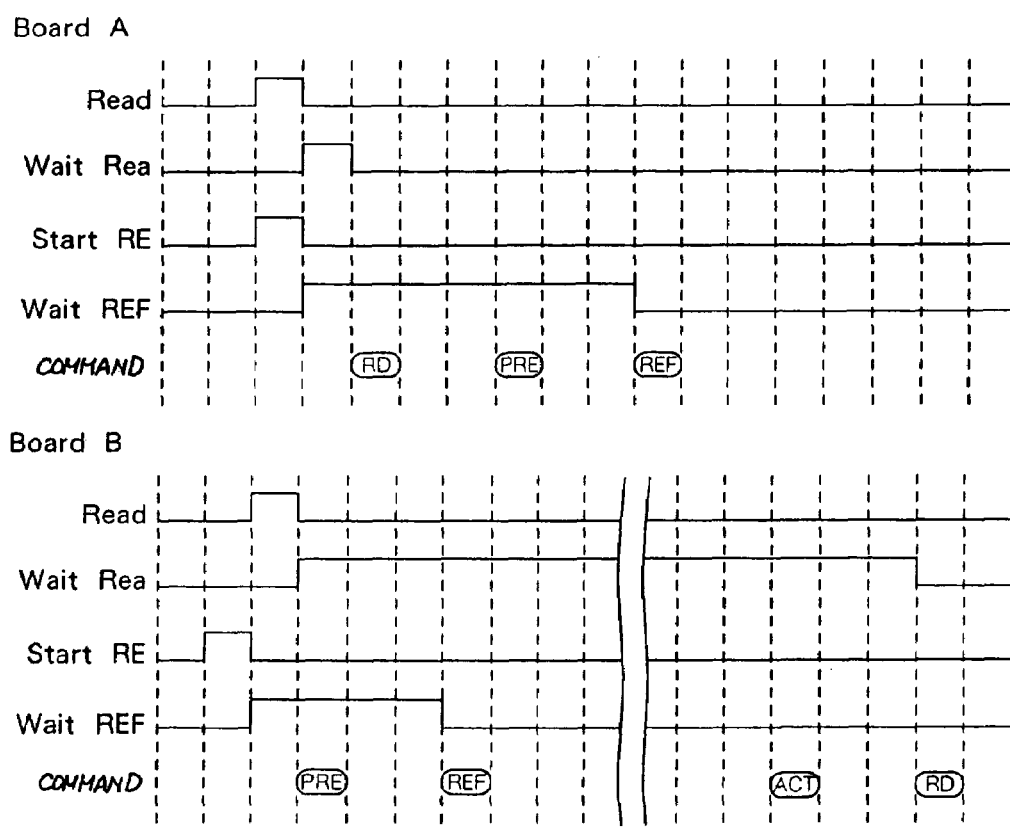
FIG. 6 is a diagram showing order of commands issued to a memory bus in the case where the timing of a refresh request is off and synchronized memory reads compete in a memory command generating portion in the fault-tolerant computer shown in FIG. 3.

In the circuit shown in FIG. 8, details of the refresh interval register 2, refresh counter 1 and refresh interval comparison portion 4 are the same as those shown in FIG. 1. The refresh timing comparison portion 3 is a comparator, and activates the refresh start signal (Start REF) 103 when the output refresh count value 101 outputted from the refresh counter 1 is "1". Here, the output refresh count value 101 outputted from the refresh counter 1 is compared with "1". However, it may also be compared with another value. In the case where an up counter of which initial value is "0" is used as the refresh counter 1, the refresh count value 101 becomes "0" during an asynchronous reset of the refresh counter 1. For that reason, caution is required because the refresh start signal (Start REF) 103 becomes continuously active in an initial state if compared with "0". As the refresh counter 1 is reset at given intervals set up by the refresh interval register 2, the refresh start signal (Start REF) 103 becomes active for 1 clock at given intervals.

Figure 9:
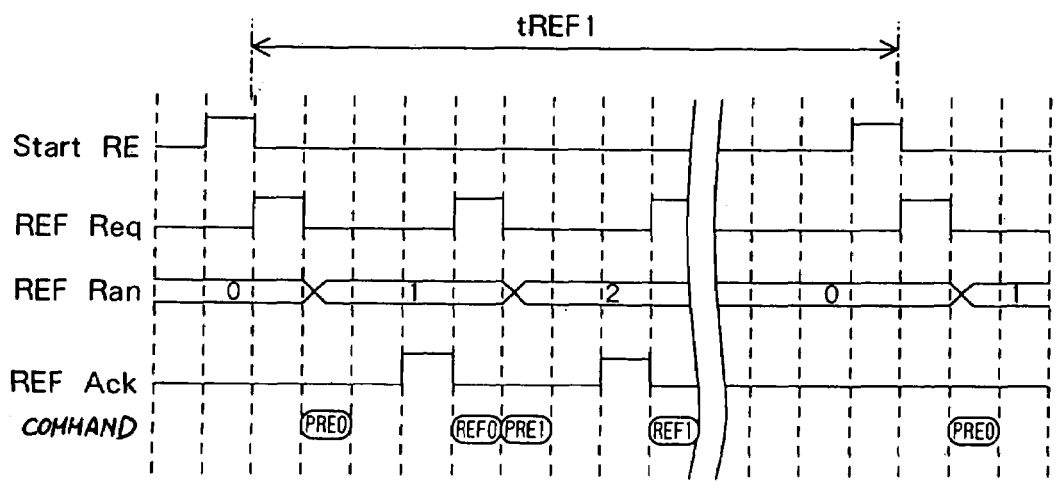
FIG. 9 is a timing chart showing the operation of a refresh rank control portion and the memory command generating portion shown in FIG. 8.

FIG. 9 is a timing chart for describing the operation of the refresh rank control portion 5 and the memory command generating portion 7 shown in FIG. 8.

On receiving the refresh start signal (Start REF) 103, the refresh rank control portion 5 outputs a refresh request signal (REF Req) 105 and a refresh rank signal (REF Rank) 106 to the memory command generating portion 7 in order to issue the refresh to all the ranks connected to the memory bus.

The memory command generating portion 7 issues the refresh to the memory of the refresh rank signal (REF Rank) 106 indicated while the refresh request signal (REF Req) 105 is active, and returns the refresh issue notification signal (REF Ack) 107 to the refresh rank control portion 5 so as to notify it that the refresh has been issued.

On receiving the refresh issue notification signal (REF Ack) 107, the refresh rank control portion 5 increments the rank number and asserts the refresh request signal (REF Req) 105 to the next refresh rank signal (REF Rank) 106. This operation is performed to all the ranks of the memory.

Figure 10:
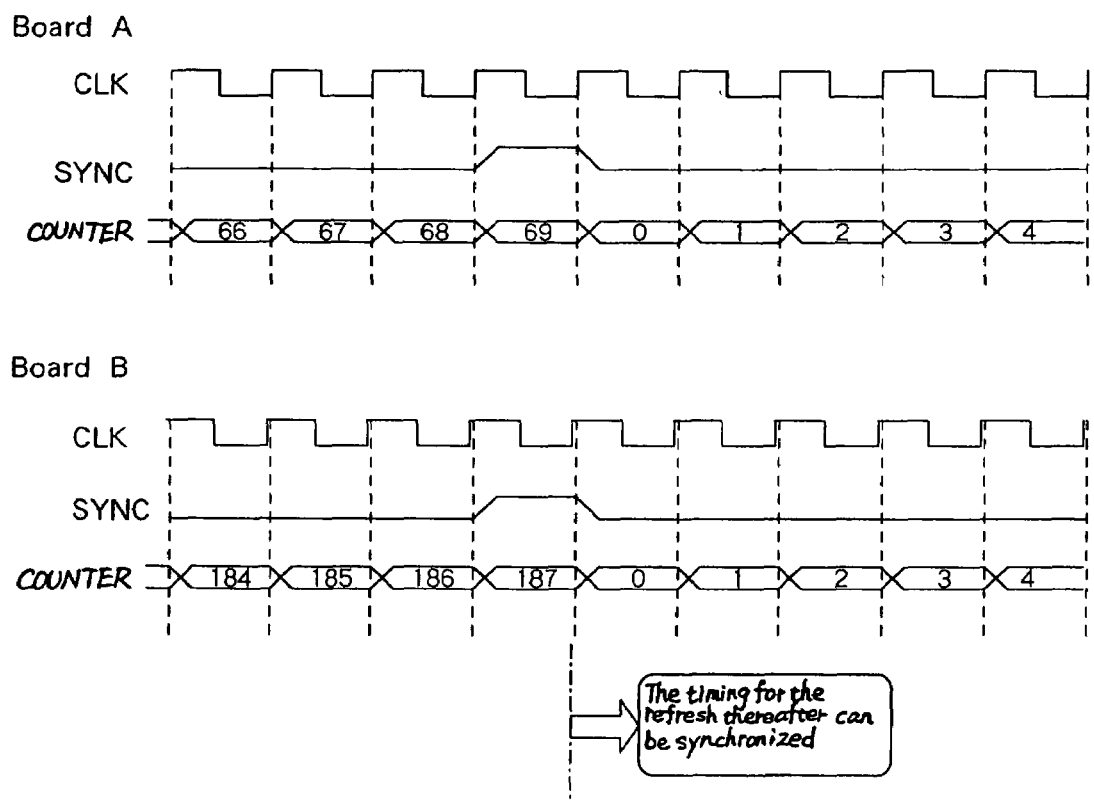
FIG. 10 are diagrams showing refresh timing of two boards using the circuit shown in FIG. 8.

Here, if the synchronous reset signal SYNC for synchronizing the system is asserted, the refresh counter 1 and the refresh rank control portion 5 become the initial value. The rank of the memory as a refresh subject is now from "0", and the refresh timing of a board A and a board B matches as shown in FIG. 10. FIG. 10 are diagrams showing the refresh timing of the two boards using the circuit shown in FIG. 8.

It is possible, by the above operation, to continuously issue the refresh to all the ranks of the memory at given intervals. In reality, there are the cases where the refresh does not continue as shown in FIG. 9 because of competition with other memory access.

Figure 11:
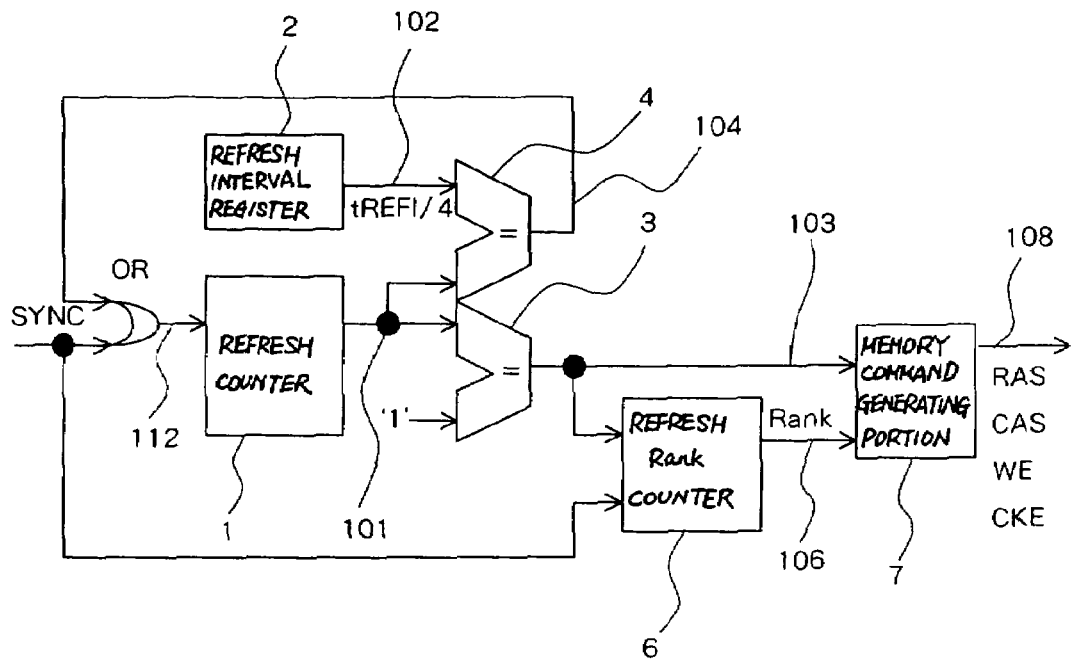
FIG. 11 is a diagram showing the circuit configuration for describing another basic operation of the refresh control circuit shown in FIG. 7.

FIG. 11 is a diagram showing the circuit configuration for describing another basic operation of the refresh control circuit shown in FIG. 7.

In the circuit shown in FIG. 11, details of the refresh interval register 2, refresh counter 1 and refresh interval comparison portion 4 are the same as those shown in FIG. 1. The details of the refresh timing comparison portion 3 are the same as those shown in FIG. 8.

Figure 12:
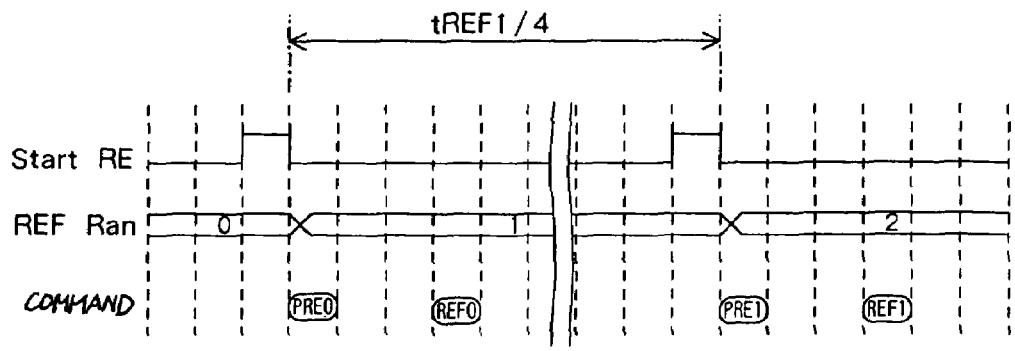
FIG. 12 is a diagram for describing the operation of a refresh rank counter and the memory command generating portion shown in FIG. 11.

FIG. 12 is a diagram for describing the operation of the refresh rank counter 6 and the memory command generating portion 7 shown in FIG. 11.

The refresh rank counter 6 decides the rank of the refresh subject memory, and counts up according to the refresh start signal (Start REF) 103. The memory command generating portion 7 issues the refresh to the memory of the refresh rank signal (REF Rank) 106 indicated while the refresh start signal (Start REF) 103 is active. According to this method, a refresh period of each individual rank (tREFI) is the number of ranks × a period of the refresh start signal (Start REF) 103. Therefore, the value of refresh period/number of ranks is set on the refresh interval register 2.

The example shown in FIG. 12 is the refresh for the memory of a four-rank configuration, and so the interval of the refresh start signal (Start REF) 103 is tREFI/4.

Figure 13:
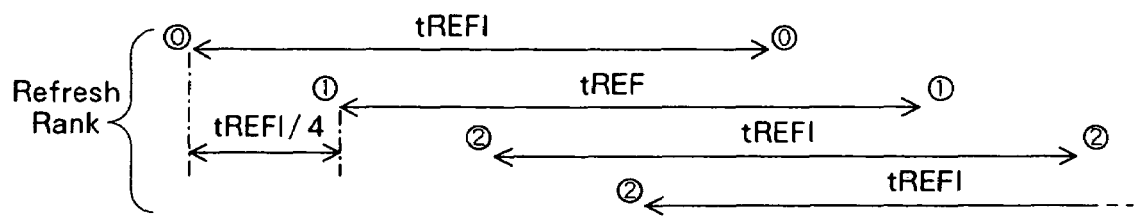
FIG. 13 is a diagram showing an appearance of the refresh for a four-rank configuration.

FIG. 13 is a diagram showing an appearance of the refresh for the four-rank configuration.

As shown in FIG. 13, the ranks to be refreshed are changed in order at intervals of tREFI/4 so that the refresh period per rank becomes tREFI.

The circuit configuration for the above-mentioned basic operation has faults described below.

In the circuit configuration shown in FIG. 8, the refresh is successively issued to all the ranks at given intervals. Therefore, in the case where there is competition with other memory access, refresh operations are intensively inserted so that temporary performance degradation is caused each time the refresh is performed.

In the circuit configuration shown in FIG. 11, the refresh is not intensively performed, and so there is no temporary degradation of memory access performance in the refresh timing as with the circuit shown in FIG. 8. Waiting is only one refresh period at the maximum, which can be resolved by keeping the refresh waiting as with the conventional technique. However, there are the cases where the refresh is not performed within prescribed time depending on the timing in which the synchronous reset signal SYNC is asserted.

Figure 14:
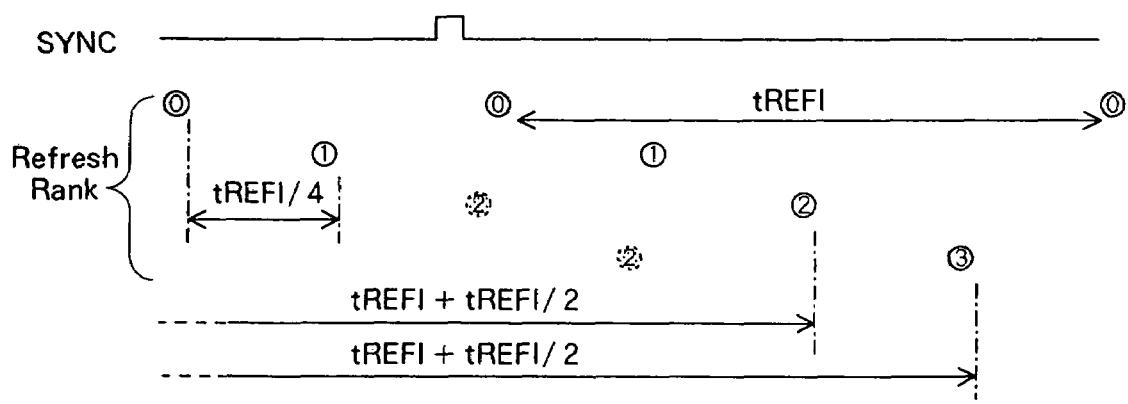
FIG. 14 is a diagram showing the case of refreshing rank 0 to rank 1 at intervals of tREFI/4 and then receiving a synchronous reset signal SYNC immediately before refreshing rank 2.

FIG. 14 is a diagram showing the case of refreshing rank 0 to rank 1 at intervals of tREFI/4 and then receiving the synchronous reset signal SYNC immediately before refreshing rank 2.

On receiving the synchronous reset signal SYNC, the refresh counter 1 and the refresh rank counter 6 are reset. For that reason, scheduled refresh to the rank 2 and rank 3 is canceled and the refresh is performed in order from rank 0. The refresh to rank 0 and rank 1 is performed within tREFI time. However, the refresh to rank 2 and rank 3 substantially exceeds tREFI, and so the contents of the memory are not assured.

In comparison, the circuit shown in FIG. 7 has no such problems as the degradation of memory performance of the circuit shown in FIG. 8 due to concentration of the refresh and the refresh period of the circuit shown in FIG. 11.

A normal refresh operation of the circuit shown in FIG. 7 is the same as that of the circuit shown in FIG. 11.

In this case, the refresh start signal (Start REF) 103 and the normal refresh rank signal 109 are selected as the refresh request signal (REF Req) 105 and the refresh rank signal (REF Rank) 106 to be inputted to the memory command generating portion 7 respectively.

In the case where the synchronous reset signal SYNC is asserted here, the refresh request signal (REF Req) 105 and the refresh rank signal (REF Rank) 106 are switched to the high-speed refresh request signal 110 and the high-speed request rank signal 111 outputted from the refresh rank control portion 5 respectively. This state lasts until the refresh is performed to all the ranks, and it returns to the normal refresh thereafter. The operation in the case of switching to the output of the refresh rank control portion 5 is the same as that shown in FIG. 8.

Figure 15:
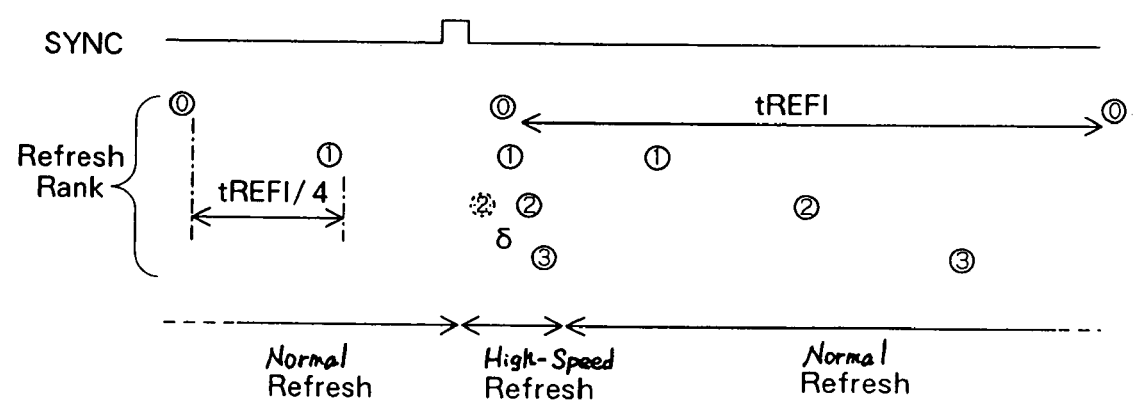
FIG. 15 is a diagram showing normal refresh timing and the refresh timing when the synchronous reset signal SYNC is asserted.

FIG. 15 is a diagram showing normal refresh timing and the refresh timing when the synchronous reset signal SYNC is asserted.

As for the normal refresh as a first process, the refresh is performed while switching the ranks in the timing of tREFI/4 which is the first interval. And if the synchronous reset signal SYNC is asserted, the refresh is successively performed to each of the ranks as high-speed refresh which is a second process.

In this example, the synchronous reset signal SYNC is asserted immediately before refreshing rank 2 as with the one shown in FIG. 14. As for the refresh timing to the rank 2, it can be issued with slight delay of (tREFI)+δ. And the refresh can be issued to rank 0, rank 1 and rank 3 in a period shorter than tREFI.

Thus, according to this embodiment, the counter as a reference of the refresh timing and the rank number of the refresh subject are initialized by the synchronous reset signal SYNC so that the refresh timing of the multiple ranks of mounted memory can be synchronized. It is also possible to perform the refresh of which influence on processing speed in normal operation is minimized by switching refresh intervals from the normal operation on synchronization processing.

OTHER EMBODIMENT

Figure 16:
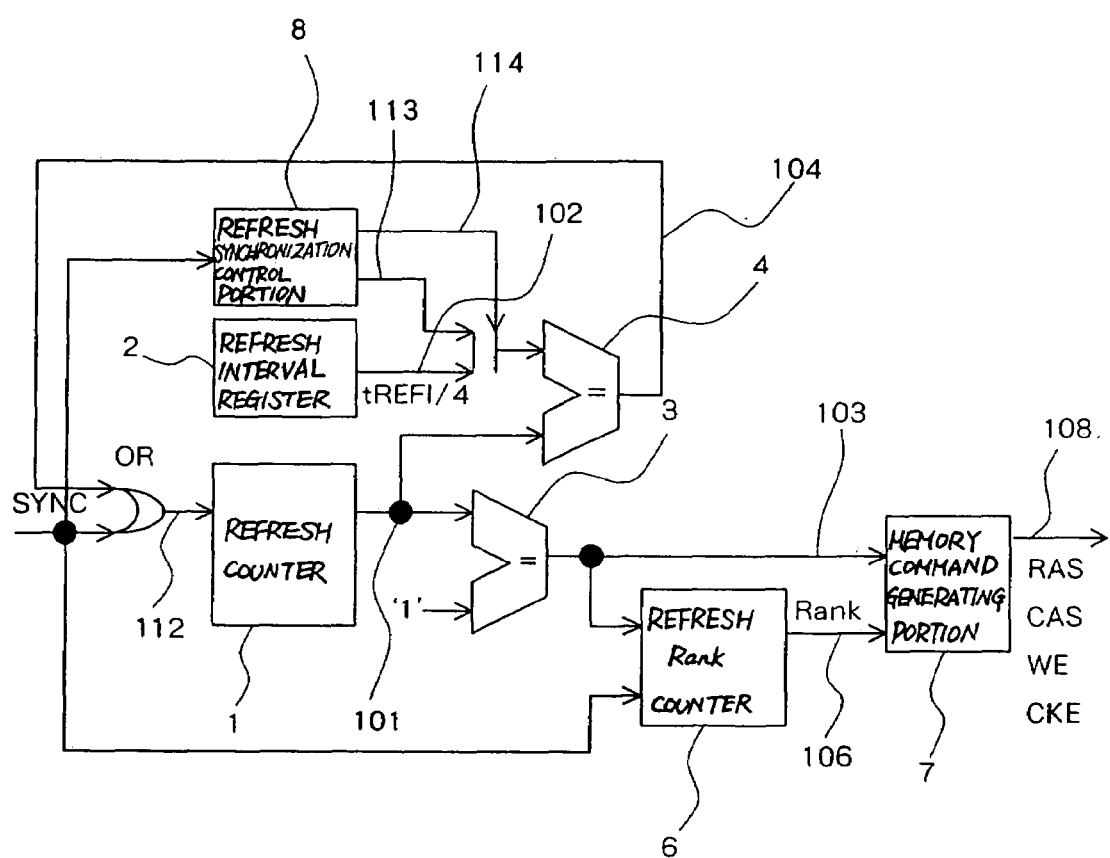
FIG. 16 is a diagram showing another embodiment of the refresh control circuit according to the present invention.

FIG. 16 is a diagram showing another embodiment of the refresh control circuit according to the present invention.

The basic configuration of this embodiment is the same as that shown in FIG. 7. However, further ingenuity is exercised as to the circuit for switching the refresh timing when the synchronous reset signal SYNC is asserted. As shown in FIG. 16, this embodiment includes a register for setting the refresh intervals which are shorter than the refresh intervals set by the refresh interval register 2, and also includes a refresh synchronization control portion 8 for using the synchronous reset signal SYNC as a trigger and outputting a value indicating the refresh intervals as a high-speed refresh interval signal 113. Furthermore, the refresh synchronization control portion 8 asserts a refresh counter asynchronous reset signal which indicates a high-speed refresh period with the synchronous reset signal SYNC as the trigger for a given period (until completion of the refresh of all the ranks).

In the state where the high-speed refresh interval signal 113 is outputted from the refresh synchronization control portion 8, the refresh interval comparison portion 4 compares the refresh count value 101 outputted from the refresh counter 1 with the high-speed refresh interval signal 113 outputted from the refresh synchronization control portion 8. In any other state, the refresh interval comparison portion 4 compares the refresh count value 101 outputted from the refresh counter 1 with the refresh interval value 102 outputted from the refresh interval register 2. In the case where they match, it outputs the refresh counter initialization signal 104 for initializing the refresh counter 1.

Thus, on synchronization processing of the refresh, the refresh interval comparison portion 4 compares the refresh count value 101 with the high-speed refresh interval signal 113 so as to allow the refresh to be issued in an earlier period than the normal refresh.

As the present invention is constituted as described above, it has the following effects.

(1) The synchronous reset signal is given in the same timing to the boards to be synchronized, and the counter as the timing for the refresh is initialized by the synchronous reset signal so that the timing for the refresh of the memory thereafter can be synchronized.

(2) The refresh is intensively performed only when the synchronous reset signal is given so that the performance degradation of normal memory access can be minimized.

While a preferred embodiment of the present invention has been described using specific terms, such description is for illustrative purposes only, and it is to be understood that changes and variations may be made without departing from the spirit or scope of the following claims.

What is claimed is:

1. A memory synchronization method for synchronizing refresh timing of multiple ranks of mounted memory, comprising:
    a first step of sequentially refreshing the multiple ranks by using a count value of a counter initialized by a synchronous reset signal at predetermined first intervals; and
    a second step of sequentially refreshing the multiple ranks with the synchronous reset signal as a trigger at second intervals which are shorter than the first intervals.

2. The memory synchronization method according to claim 1, wherein:
    the first step refreshes the multiple ranks in sequence by incrementing a rank number indicating a refresh subject rank each time the count value of the counter becomes a predetermined value; and
    the second step continuously refreshes the multiple ranks in sequence by incrementing the rank number indicating the refresh subject rank each time there is notification that refresh has been issued to the rank.

3. The memory synchronization method according to claim 1, wherein
    the first step refreshes the multiple ranks in sequence by incrementing a rank number indicating a refresh subject rank each time the count value of the counter becomes a predetermined value; and
    the second step initializes the counter with the synchronous reset signal as the trigger at the second intervals and refreshes the multiple ranks in sequence by incrementing the rank number indicating the refresh subject rank each time the count value of the counter becomes the predetermined value.

4. A refresh control circuit for synchronizing refresh timing of multiple ranks of mounted memory, comprising:

a first counter which is initialized by a synchronous reset signal and counts timing for performing refresh;

refresh interval setting means for setting refresh intervals and outputting a value indicating the intervals;

first comparison means for outputting an initialization signal for initializing the first counter in the case where a comparison is made between a count value of the first counter and the value outputted from the refresh interval setting means and they match;

second comparison means for outputting a refresh start signal in the case where the count value of the first counter becomes a predetermined value;

a second counter which is initialized by a synchronous reset signal and counts up and outputs the count value as a rank number each time the refresh start signal is outputted from the second comparison means;

memory command generating means for generating a command for refreshing the rank of the rank number outputted from the second counter according to the refresh start signal and outputting a refresh issue notification signal in the case where refresh is issued to the rank; and refresh rank control means for, in the case where the refresh issue notification signal is outputted from the memory command generating means with the synchronous reset signal as a trigger, incrementing the rank number included in the refresh issue notification signal and outputting the rank number together with a high-speed refresh request signal, and wherein:

the memory command generating means generates a command for refreshing the rank of the rank number outputted together with the high-speed refresh request signal in the case where the high-speed refresh request signal is outputted from the refresh rank control means.

5. A refresh control circuit for synchronizing refresh timing of multiple ranks of mounted memory, comprising:

a first counter which is initialized by a synchronous reset signal and counts timing for performing refresh;

refresh interval setting means for setting refresh intervals and outputting a value indicating the intervals;

refresh synchronization control means for setting intervals shorter than the intervals set by the refresh interval setting means and outputting a value indicating the intervals with the synchronous reset signal as a trigger;

first comparison means for comparing a count value of the first counter with the value outputted from the refresh synchronization control means in the case where the value indicating the intervals is outputted by the refresh synchronization control means and comparing the count value of the first counter with the value outputted from the refresh interval setting means in any other case so as to output an initialization signal for initializing the first counter when they match;

second comparison means for getting initialized by the synchronous reset signal and outputting a refresh start signal in the case where the count value of the first counter becomes a predetermined value;

a second counter which counts up and outputs the count value as a rank number each time the refresh start signal is outputted from the second comparison means; and memory command generating means for generating a command for refreshing the rank of the rank number outputted from the second counter according to the refresh start signal.

* * * * *